(12) United States Patent
Lee et al.

(10) Patent No.: US 6,745,824 B2
(45) Date of Patent: Jun. 8, 2004

(54) HEAT DISSIPATION DEVICE

(75) Inventors: Hsieh Kun Lee, Tu-chen (TW);
Chun-Chi Chen, Tu-chen (TW);
Winsan Peng, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/323,474

(22) Filed: Dec. 20, 2002

(65) Prior Publication Data

US 2003/0230398 A1 Dec. 18, 2003

(30) Foreign Application Priority Data

Jun. 13, 2002 (TW) ...................................... 91208819 U

(51) Int. Cl.[7] .............................................. F28D 15/00
(52) U.S. Cl. ............................. 165/104.14; 165/80.3; 165/121; 165/104.33; 165/185; 361/697; 361/700; 257/715; 257/722; 174/15.2; 174/16.3
(58) Field of Search ........................... 165/80.3, 80.4, 165/104.21, 104.33, 104.14, 185, 121, 122; 361/687, 697, 700, 709, 710; 257/714, 715, 722; 174/15.2, 16.3

(56) References Cited

U.S. PATENT DOCUMENTS

| | | | | |
|---|---|---|---|---|
| 3,143,592 A | * | 8/1964 | August | 165/104.33 |
| 5,959,837 A | * | 9/1999 | Yu | 165/104.33 |
| 6,041,850 A | * | 3/2000 | Esser et al. | 165/104.66 |
| 6,230,788 B1 | * | 5/2001 | Choo et al. | 165/104.14 |
| 6,382,307 B1 | * | 5/2002 | Wang et al. | 165/104.33 |
| 6,394,175 B1 | * | 5/2002 | Chen et al. | 165/104.33 |
| 6,542,364 B2 | * | 4/2003 | Lai et al. | 165/104.33 |

* cited by examiner

*Primary Examiner*—Christopher Atkinson
(74) *Attorney, Agent, or Firm*—Wei Te Chung

(57) ABSTRACT

A heat dissipation device includes a heat sink (20), heat pipes (30), a frame (40), and a fan (50). Each heat pipe has a lower first connecting portion (32) and an upper second connecting portion (34). The heat sink includes a base (21), and parallel fins (27) attached on the base. The base includes a top plate (25), and defines a hermetically sealed chamber. Apertures (23) are defined in one side wall (22) of the base, the apertures receiving the first connecting portions. Through holes (29) are transversely defined through the fins, the through holes receiving the second connecting portions. The frame includes an upper plate (41), and two side plates (47). Two arms (49) of each side plate secures the frame on the heat sink. In operation, working liquid in the chamber transfers heat to the top plate and to the second connecting portions by phase transition.

20 Claims, 5 Drawing Sheets

HEAT DISSIPATION DEVICE

BACKGROUND OF THE INVENTION

1. Field of the Invention

The present invention relates to heat dissipation devices, and more particularly to a heat dissipation device which incorporates a vapor chamber and a plurality of heat pipes.

2. Description of Prior Art

During operation of many heat generating devices such as central processing units (CPUs), large amounts of heat are produced. Such heat must be quickly removed from the heat generating device, to prevent the heat generating device from becoming unstable or being damaged. Typically, a heat dissipation device is attached to an outer surface of a heat generating device to remove heat therefrom.

Referring to FIG. 5, a conventional heat dissipation device comprises a chassis 2 and a plurality of hollow fins 4 attached to the chassis 2. The chassis 2 has a plurality of grooves 6. The grooves 6 together with corresponding hollow fins 4 define vapor chambers, which accommodate working fluid 8 therein. In operation, the chassis 2 conductively absorbs heat from a heat-generating device. The working fluid 8 at evaporating ends of the chambers absorbs such heat, and is vaporized. The vapor flows to the hollow fins 4 where it condenses and releases latent heat. The condensed working fluid 8 then returns to the evaporating ends through wicking structures that provide capillary forces. However, convection of the working liquid 8 within the chassis 2 is often poor. As a result, the heat dissipation device cannot adequately dissipate heat from the heat-generating device.

Referring to FIG. 6, another conventional heat dissipation device 10 comprises a metal block 15, a heat pipe 11 and a plurality of parallel fins 12. The metal block 15 is directly mounted on an outer surface of a heat-generating device (not shown). One end of the heat pipe 11 is engaged in an aperture 13 of the metal block 15, and an opposite end of the heat pipe 11 is extended through apertures 14 of the fins 12 to be in intimate thermal contact with the fins 12. However, the thermal contact surface of both ends of the heat pipe is limited. Accordingly, the heat removal capability of the heat dissipation device is frequently not sufficient.

Thus, an improved heat dissipation device which can overcome the above-mentioned problems is strongly desired.

SUMMARY OF THE INVENTION

Accordingly, an object of the present invention is to provide a heat dissipation device which incorporates a vapor chamber and a plurality of heat pipes to attain great heat removal capability.

Another object of the present invention is to provide a heat dissipation device having a simple and compact structure.

In order to achieve the objects set out above, a heat dissipation device of the present invention includes a heat sink, a plurality of heat pipes, a frame and a fan. Each heat pipe has a lower first connecting portion and an upper second connecting portion. The heat sink includes a base, and a plurality of parallel fins attached on the base. The base comprises a top plate, and defines a hermetically sealed chamber. A plurality of apertures is defined in one side wall of the base, the apertures receiving the first connecting portions of the heat pipes. A plurality of through holes is transversely defined through the plurality of fins of the heat sink, the through holes receiving the second connecting portions of the heat pipes. The frame includes an upper plate, and two side plates depending from the upper plate. A pair of arms depends from respective opposite ends of a bottom portion of each side plate, the arms securing the frame on the heat sink. In operation, working liquid in the chamber transfers heat to the top plate by phase transition. The working liquid also transfers heat to the second connecting portions of the heat pipes by phase transition.

Other objects, advantages and novel features of the present invention will become more apparent from the following detailed description when taken in conjunction with the accompanying drawings.

DETAILED DESCRIPTION OF THE INVENTION

Figure 1:
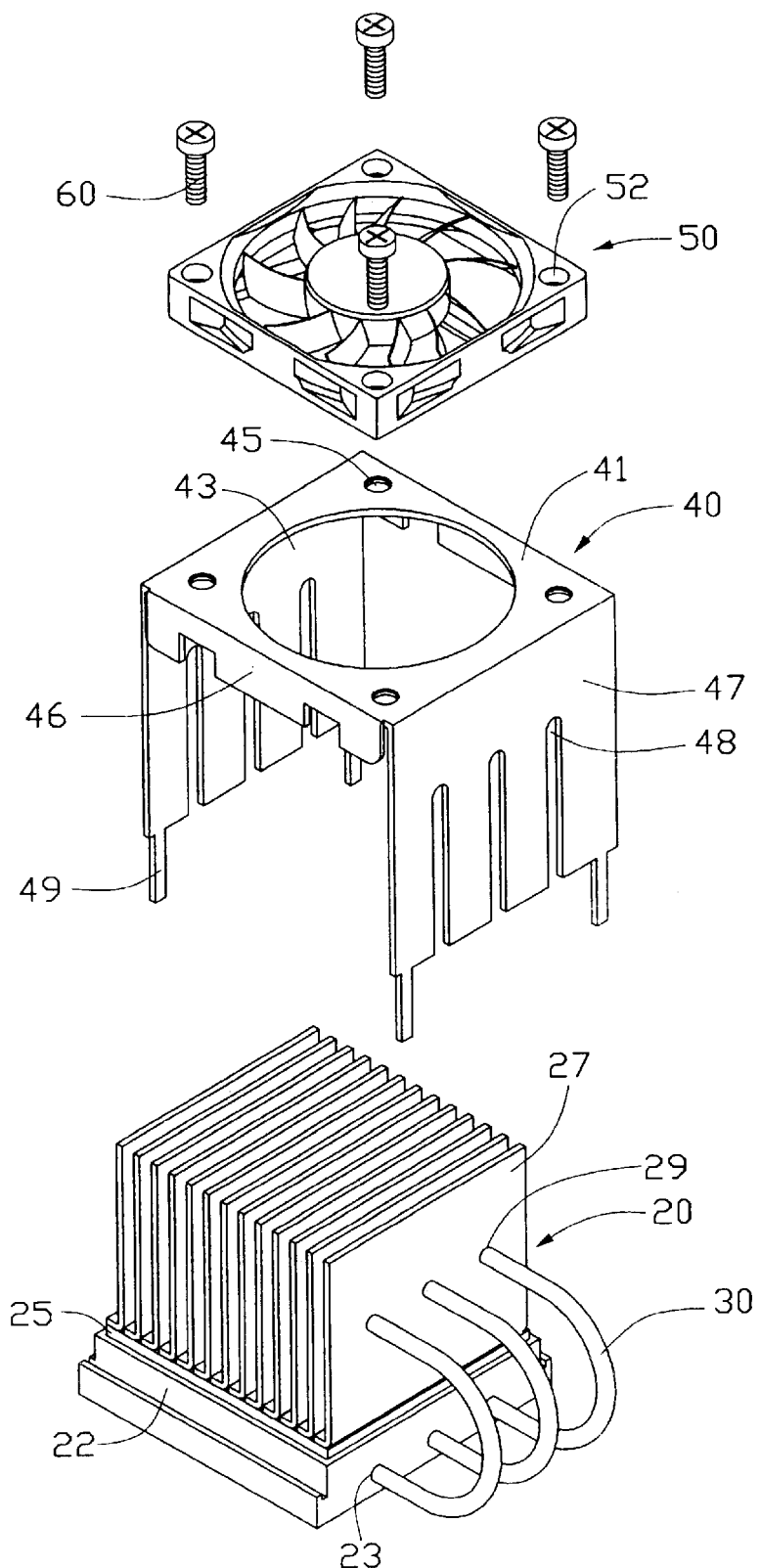
FIG. 1 is an exploded isometric view of a heat dissipation device in accordance with the present invention.

Reference will now be made to the drawing figures to describe the present invention in detail.

Referring to FIG. 1, a heat dissipation device of the present invention comprises a heat sink 20, a plurality of heat pipes 30, a frame 40 and a fan 50.

Figure 3:
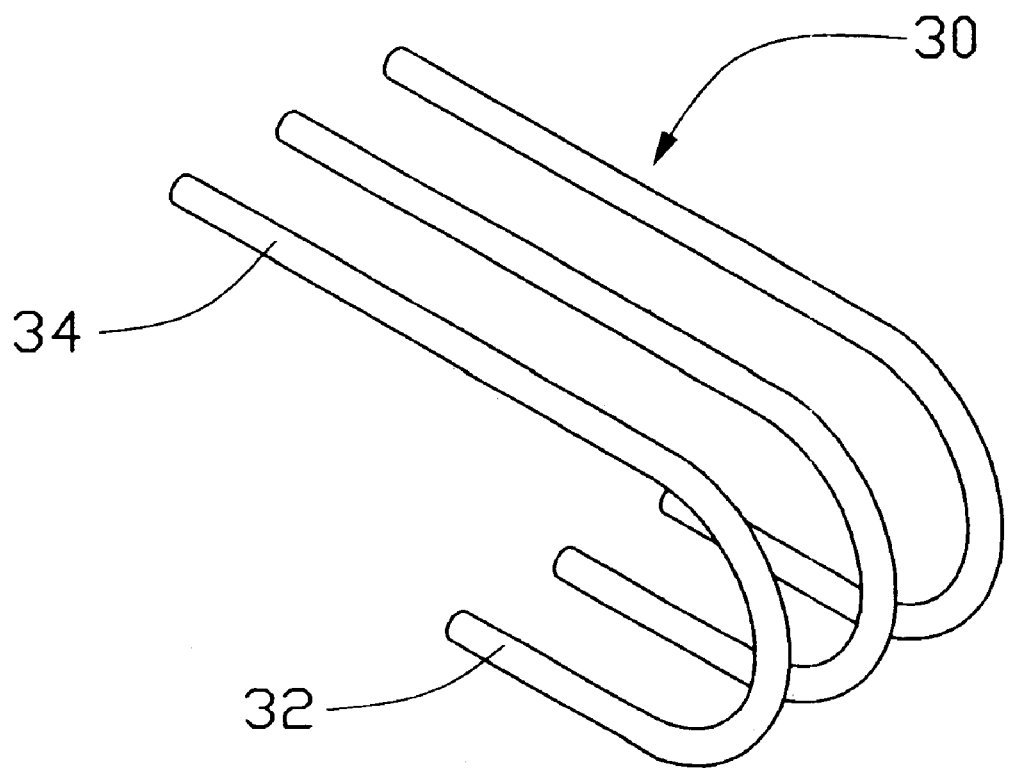
FIG. 3 is an isometric view of heat pipes of the heat dissipation device of FIG. 1.

Referring also to FIG. 3, the heat pipes 30 are hollow and contain suitable working liquid (not shown) having great latent heat. Each heat pipe 30 has a lower first connecting portion 32 and an upper second connecting portion 34.

Figure 2:
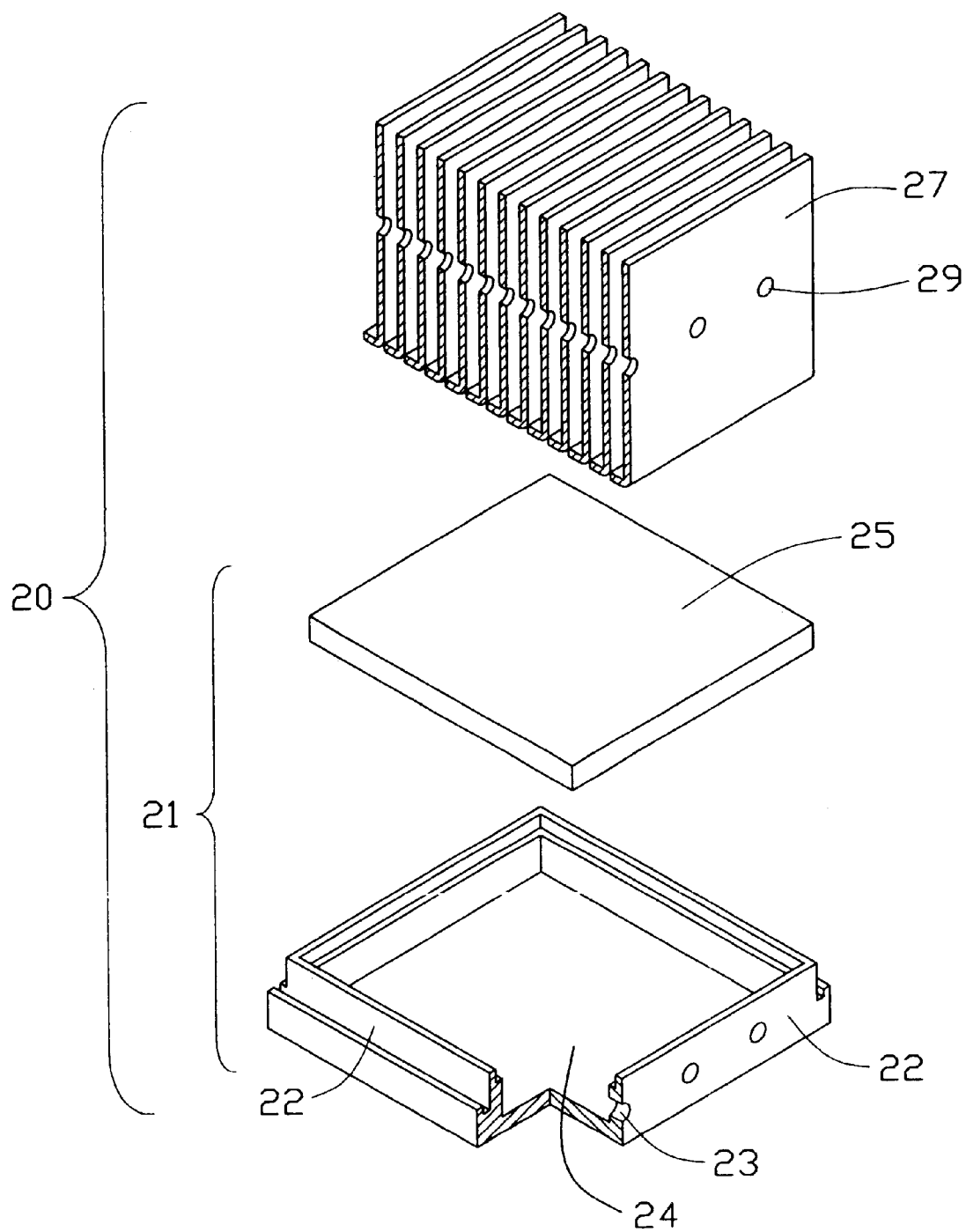
FIG. 2 is an exploded isometric view of a heat sink of the heat dissipation device of FIG. 1, the heat sink being partly cut away.

Referring also to FIG. 2, the heat sink 20 includes a base 21 and a plurality of parallel fins 27 attached on the base 21. The base 21 is for thermal attachment to an upper surface of a heat-generating electronic device (not shown). The base 21 comprises a bottom wall 24 and four side walls 22 integrally formed with the bottom wall, and a top plate 25 mounted at a top of the side walls 22 thereby defining a hermetically sealed chamber therebetween. Suitable working liquid (not shown) having great latent heat is received in the chamber. A plurality of apertures 23 is defined in one side wall 22, for respectively receiving the first connecting portions 32 of the heat pipes 30. Each fin 27 is a plate having an L-shaped profile. A plurality of through holes 29 is transversely defined through the plurality of fins 27, for respectively receiving the second connecting portions 34 of the heat pipes 30.

Referring to FIG. 1, the frame 40 comprises an upper plate 41 and two side plates 47 depending from two opposite side edges of the upper plate 41 respectively. The upper plate 41 defines an airflow outlet 43 in a center thereof, and four evenly spaced locking holes 45 around the outlet 43. Two flanges 46 depend from another two opposite side edges of the upper plate 41 respectively. A pair of arms 49 depends from respective opposite ends of a bottom portion of each side plate 47, for securing the frame 40 on the heat sink 20. A plurality of evenly spaced, parallel vertical slots 48 is defined in each side plate 47.

The fan 50 defines four through holes 52 in four corners thereof respectively, for extension of four screws 60 therethrough to engage in the locking holes 45 of the frame 40.

Figure 4:
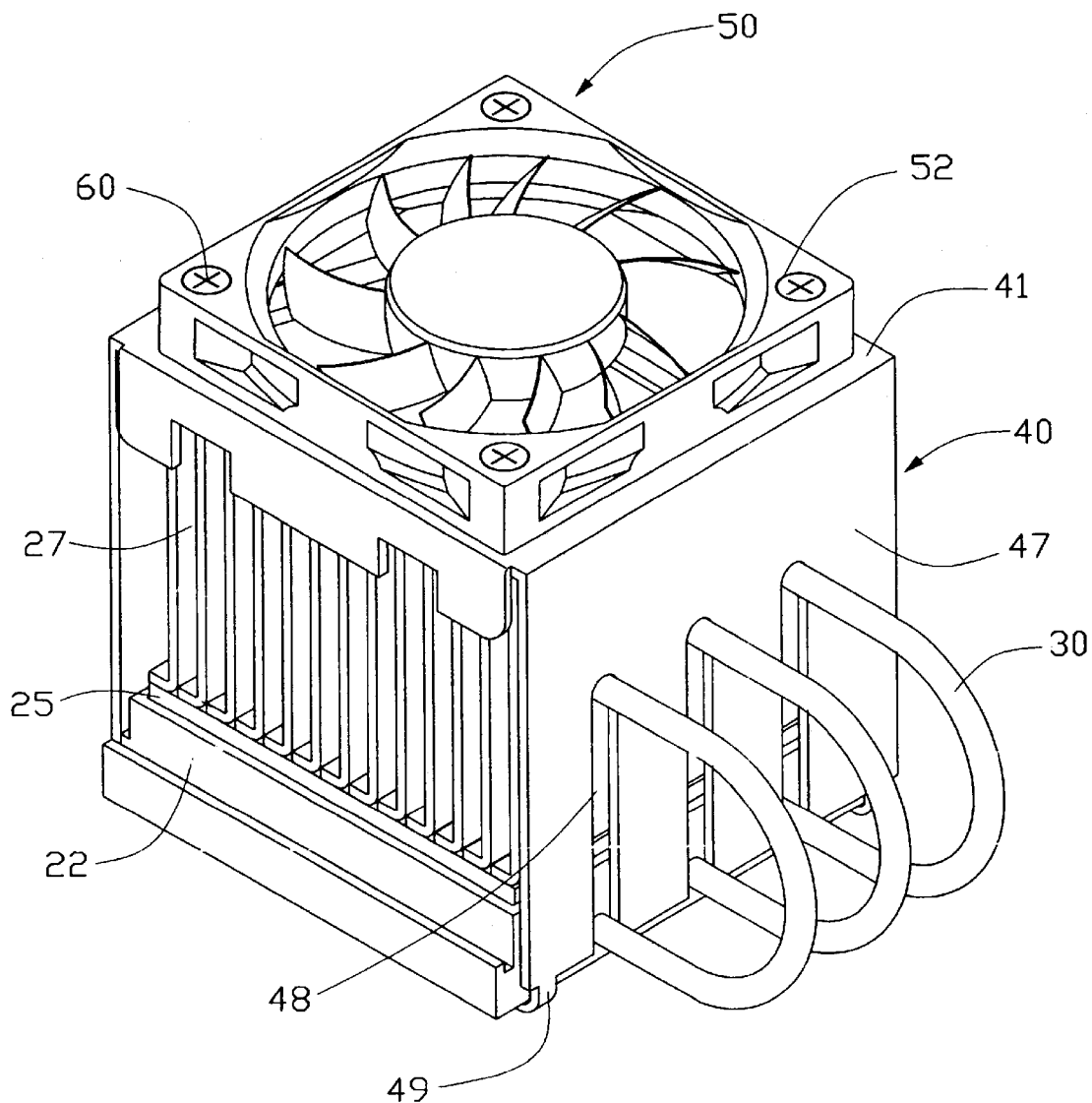
FIG. 4 is an enlarged, assembled view of FIG. 1.
Figure 5:
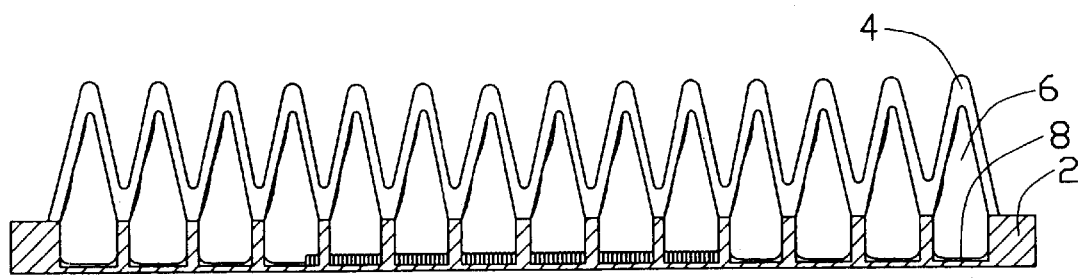
FIG. 5 is a cross-sectional side plan view of a conventional heat dissipation device.
Figure 6:
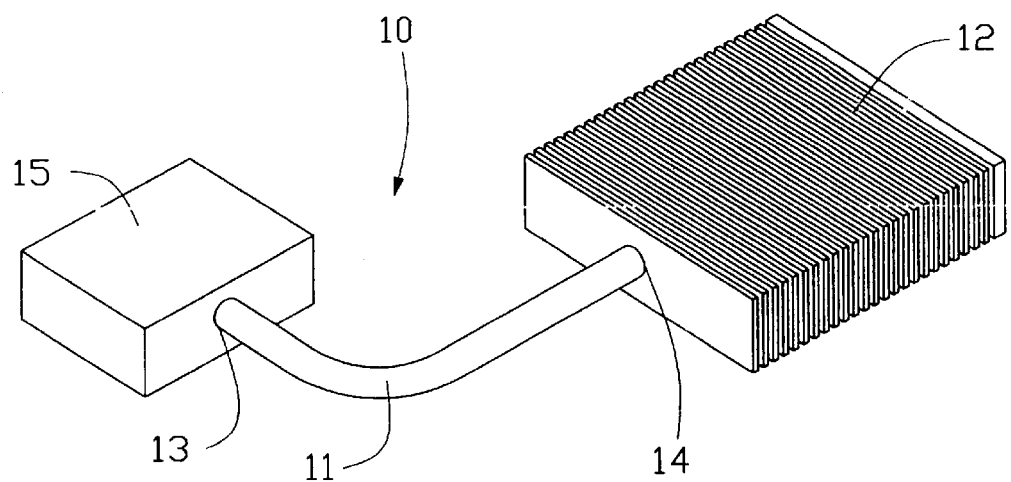
FIG. 6 is an isometric view of another conventional heat dissipation device.

Referring also to FIG. 4, in assembly, the first connecting portions 32 of the heat pipes 30 are extended into the apertures 23 of said one side wall 22 of the base 21. The second connecting portions 34 of the heat pipes 30 are extended into the through holes 29 of the fins 27 of the heat sink 20. The fan 50 is attached onto the upper plate 41 of the frame 40 by the screws 60. The frame 40 substantially covers the fins 27 of the heat sink 20. The flanges 46 of frame 40 abut against corresponding ends of the fins 27. The slots 48 in the side plates 47 of the frame 40 receive the heat pipes 30 therethrough. The arms 49 of the frame 40 are bent inwardly under the bottom wall of the base 21 of the heat sink 20, thereby securing the frame 40 on the heat sink 20.

In operation, the base 21 of the heat sink 20 absorbs heat from the heat-generating electronic device. The working liquid in the chamber absorbs the heat, and transfers the heat to the top plate 25 by phase transition. The heat is then conducted to bottom portions of the fins 27. The working liquid in and near the first connecting portions 32 of the heat pipes 30 also absorbs heat, and transfers the heat to the second connecting portions 32 of the heat pipes 30 by phase transition. The heat is then conducted to central portions of the fins 27.

Because the heat dissipation device of the present invention transfers heat in the two above-described ways, the heat can be rapidly dissipated from the fins 27.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a plurality of heat pipes, each of the heat pipes having a lower first connecting portion and an upper second connecting portion;
   a heat sink comprising a base and a plurality of parallel fins arranged on the base, a plurality of apertures defined in one side wall of the base and receiving the first connecting portions of the heat pipes, a plurality of through holes defined through the plurality of fins and receiving the second connecting portions of the heat pipes;
   a frame supported on the heat sink, the frame comprising an upper plate and two side plates depending from two opposite side edges of the upper plate, a pair of arms depending from respective opposite ends of a bottom portion of each of the side plates and engaging with the heat sink thereby securing the frame on the heat sink; and
   a fan mounted on the frame for enhancing air flow.

2. The heat dissipation device as described in claim 1, wherein the base has a bottom wall and four side walls integrally formed with the bottom wall, and a top plate mounted at a top of the side walls thereby defining a hermetically sealed chamber therebetween.

3. The heat dissipation device as described in claim 2, wherein working liquid having great latent heat is received in the chamber.

4. The heat dissipation device as described in claim 3, wherein each of the fins is a plate having an L-shaped profile.

5. The heat dissipation device as described in claim 1, wherein the upper plate of the frame defines an airflow outlet in a center thereof, and a plurality of locking holes around the outlet.

6. The heat dissipation device as described in claim 1, wherein two flanges depend from another two opposite side edges of the upper plate respectively.

7. The heat dissipation device as described in claim 5, wherein a plurality of slots is defined in at least one of the side plates of the frame, the slots receiving the heat pipes therethrough.

8. The heat dissipation device as described in claim 7, wherein the fan defines a plurality of holes for extension of a plurality of fasteners therethrough to engage in the locking holes of the frame thereby securing the fan to the frame.

9. A heat dissipation device comprising:
   a plurality of heat pipes, each of the heat pipes having a lower first connecting portion and an upper second connecting portion; and
   a heat sink comprising:
      a base; and
      a plurality of parallel fins attached on the base,
      wherein the base comprises a bottom wall and four side walls integrally formed with the bottom wall, and a top plate mounted at a top of the side walls thereby defining a hermetically sealed chamber therebetween, a plurality of apertures being defined in one of the side walls, the apertures receiving the first connecting portions of the heat pipes, a plurality of through holes being defined through the plurality of fins, the through holes receiving the second connecting portions of the heat pipes.

10. The heat dissipation device as described in claim 9, wherein working liquid having great latent heat is received in the chamber.

11. The heat dissipation device as described in claim 10, wherein each of the fins is a plate having an L-shaped profile.

12. The heat dissipation device as described in claim 11, further comprising a fan and a frame mounting the fan on the heat sink.

13. The heat dissipation device as described in claim 12, wherein the frame comprises an upper plate and two side plates depending from two opposite side edges of the upper plate respectively.

14. The heat dissipation device as described in claim 13, wherein the upper plate defines an airflow outlet in a center thereof, and a plurality of locking holes around the outlet.

15. The heat dissipation device as described in claim 14, wherein two flanges depend from another two opposite side edges of the upper plate respectively.

16. The heat dissipation device as described in claim 13, wherein a pair of arms depends from respective opposite ends of a bottom portion of each of the side plates, the arms engaging with the base thereby securing the frame on the heat sink.

17. The heat dissipation device as described in claim 16, wherein a plurality of slots is defined in at least one of the side plates of the frame, the slots receiving the heat pipes therethrough.

18. The heat dissipation device as described in claim 14, wherein the fan defines a plurality of holes for extension of a plurality of fasteners therethrough to engage in the locking holes of the frame thereby securing the fan to the frame.

19. A heat dissipation device comprising:

a heat sink including a base adapted to engage a heat generating device;

an interior space defined in said base;

a plurality of fins engageably extending upwardly from a top wall of the base;

a plurality of heat pipes with working liquid therein with one end connected to the base and communicating with the interior space, and the other end extending through said fins.

20. The device as described in claim 19, wherein a frame with a fan thereon, is mounted to the heat sink, and said frame defines a plurality of slots to allow passage of said heat pipes during assembling.

* * * * *